US010651877B2

(12) United States Patent
 Zhang

(10) Patent No.: US 10,651,877 B2
(45) Date of Patent: May 12, 2020

(54) SHELL STRUCTURE WITH DAMPING LOCK CATCHES FOR TERMINALS

(71) Applicant: ZTE CORPORATION, Shenzhen, Guangdong Province (CN)

(72) Inventor: Lei Zhang, Shenzhen (CN)

(73) Assignee: ZTE CORPORATION (CN)

( * ) Notice: Subject to any disclaimer, the term of this patent is extended or adjusted under 35 U.S.C. 154(b) by 0 days.

(21) Appl. No.: 16/099,440

(22) PCT Filed: Jul. 6, 2016

(86) PCT No.: PCT/CN2016/088922
§ 371 (c)(1),
(2) Date: Nov. 7, 2018

(87) PCT Pub. No.: WO2017/197741
PCT Pub. Date: Nov. 23, 2017

(65) Prior Publication Data
US 2019/0149179 A1    May 16, 2019

(30) Foreign Application Priority Data

May 20, 2016   (CN) .................... 2016 2 0466753 U

(51) Int. Cl.
*H04B 1/08* (2006.01)
*H04B 1/38* (2015.01)
*H04M 1/02* (2006.01)
*H05K 5/02* (2006.01)
*H04B 1/3827* (2015.01)

(52) U.S. Cl.
CPC ............... *H04B 1/086* (2013.01); *H04B 1/08* (2013.01); *H04B 1/3827* (2013.01); *H04M 1/02* (2013.01); *H04M 1/0202* (2013.01); *H05K 5/02* (2013.01); *H05K 5/0247* (2013.01)

(58) Field of Classification Search
CPC .. H04B 1/3888; H04B 1/3883; H04B 1/3833; H04B 1/385; H04M 1/02; H04M 1/0202; H04M 1/0249; H04M 1/0252; H04M 1/026
USPC .................. 455/571.1–575.9, 128, 347, 351
See application file for complete search history.

(56) References Cited

U.S. PATENT DOCUMENTS

| 2012/0120566 A1* | 5/2012 | Miao | ................... H04M 1/0249 361/679.01 |
| 2012/0160733 A1 | 6/2012 | Liang | |
| 2018/0094470 A1* | 4/2018 | Sase | ........................ E05F 11/38 |

FOREIGN PATENT DOCUMENTS

| CN | 201797668 U | 4/2011 |
| CN | 102045969 A | 5/2011 |
| CN | 204518249 U | 7/2015 |

* cited by examiner

*Primary Examiner* — Philip Sobutka
(74) *Attorney, Agent, or Firm* — McDonald Hopkins LLC

(57) ABSTRACT

Provided are a shell structure and a terminal device. The shell structure includes a first shell; herein, multiple lock catch structures are installed on an inner surface of the first shell and a first through hole is formed by the lock catch structure. A damping plate and a compression part are sequentially arranged in a direction facing the first shell in the first through hole, and the first through hole is connected with the damping plate in a clamping way.

13 Claims, 3 Drawing Sheets

SHELL STRUCTURE WITH DAMPING LOCK CATCHES FOR TERMINALS

CROSS-REFERENCE TO RELATED APPLICATIONS

The present application is a U.S. National Phase Entry of International PCT Application No. PCT/CN2016/088922 having an international filing date of Jul. 6, 2016, which claims priority to Chinese Patent Application No. 201620466753.6 filed on May 20, 2016. The present application claims priority and the benefit of the above-identified applications and the above-identified applications are incorporated by reference herein in their entirety.

TECHNICAL FIELD

The present application relates, but is not limited, to the technical field of electronic equipment, and in particular to a shell structure and a terminal device.

BACKGROUND

Currently, a touch screen made of glass is the weakest structural part of a large-screen terminal device, such as a smart phone. The touch screen may be easily broken when subjected to a strong impact, thereby causing unnecessary loss.

A protective structure of the terminal device generally includes three ways at present: secondary hardening of glass material, double-layer glass scheme, phone case and protection of other accessories. Herein, a process of the secondary hardening of glass material is complicated. The double-layer glass solution is applicable to an Organic Light-emitting Diode (OLED) screen, however it is very difficult to fabricate a display module matching with a double-layer glass. Generally, a user would take the phone case and other accessories to protect the terminal device, while these accessories are not applicable to a whole machine manufacturer.

SUMMARY

The following is an overview of a subject described in the present document in detail. The overview is not intended to limit the protection scope of claims.

The present application provides a shell structure and a terminal device, thereby solving the problem that a glass touch screen is easily broken and losses are caused accordingly when the terminal device is subjected to an impact.

An embodiment of the present application provides a shell structure including a first shell. Herein, multiple lock catch structures are installed on an inner surface of the first shell and a first through hole is formed by the lock catch structure. A damping plate and a compression part are sequentially arranged in a direction facing the first shell in the first through hole, and the first through hole is connected with the damping plate in a clamping way.

In an exemplary embodiment, the first through hole includes a first round hole with a first diameter and a second round hole with a second diameter, and the first round hole is coaxial and connected with the second round hole. The second diameter is less than the first diameter. The second round hole is located at one end of the lock catch structure facing the first shell.

The compression part is located at one end of the first round hole facing the first shell. A first clamping part is formed on an inner wall of the first round hole, and the damping plate has a second clamping part. The first clamping part and the second clamping part are clamped with each other, to form a clamping structure. The damping plate is stuck in the first round hole.

In an exemplary embodiment, the shell structure further includes a second shell which is arranged opposite to the first shell; herein, the lock catch structure is arranged on the inner surface of the first shell facing the second shell.

In an exemplary embodiment, a second through hole matching with a self-tapping screw is formed by the damping plate and the compression part. The second shell is provided with a self-tapping stud matching with the self-tapping screw. a rigid connection of the self-tapping screw with the self-tapping stud is formed through the second through hole, to connect the first shell with the second shell.

In an exemplary embodiment, the rigid connection transfers a pressure to the damping plate when the first shell or the second shell is subjected to the pressure facing the inside of the shell structure, and the second clamping part is departed from the first clamping part when the pressure reaches a preset threshold. The damping plate compresses the compression part, to make the compression part deformed.

In an exemplary embodiment, an avoiding space allowing deformation of the compression part is formed between the first round hole and the compression part.

A damping gap allowing deformation of the compression part is formed between the damping plate and the compression part.

A deformation space allowing deformation of the lock catch structure is formed between the lock catch structure and a side wall of the first shell.

In an exemplary embodiment, the first clamping part is a bulge structure located on a side surrounding part of the damping plate, and the second clamping part is a groove structure matching with the first clamping part.

In an exemplary embodiment, the damping plate is made of polycarbonate or polyformaldehyde.

The compression part is made of silica gel.

The lock catch structure is a columnar hollow structure and made of Thermoplastic Polyurethanes (TPU) having a Shore hardness within a preset range.

An embodiment of the present application further provides a terminal device, and the terminal device includes any one of the above-mentioned shell structures.

In an exemplary embodiment, the terminal device further includes a touch screen which is fixedly connected with a second shell of the shell structure.

The mentioned scheme of the present application has the beneficial effects below:

In the shell structure and the terminal device provided by the present application, by arranging the damping plate and the compression part which are departed from each other in the lock catch structure, thereby effectively damping an external impact to which the shell structure is subjected and avoiding losses due to of breaking of the touch screen when the touch screen subjected to the impact. The present application has simple fabricating process and low manufacturing cost, and may improve reliability and user experiences of the terminal device and generate a high economic value added. Other aspects may be understood after reading and comprehending drawings and detailed description.

Description of Numbers in Drawings 1. first shell; 2. second shell; 3. lock catch structure; 4. self-tapping stud; 5. first through hole; 501. first round hole; 5011. first clamping part; 502. second round hole; 6. damping plate; 601. second clamping part; 7. compression part; 8. self-tapping screw; and 9, touch screen.

DETAILED DESCRIPTION

The scheme of the present application will be described in detail below in combination with drawings and specific embodiments.

The present application provides a shell structure and a terminal device.

Figure 1:
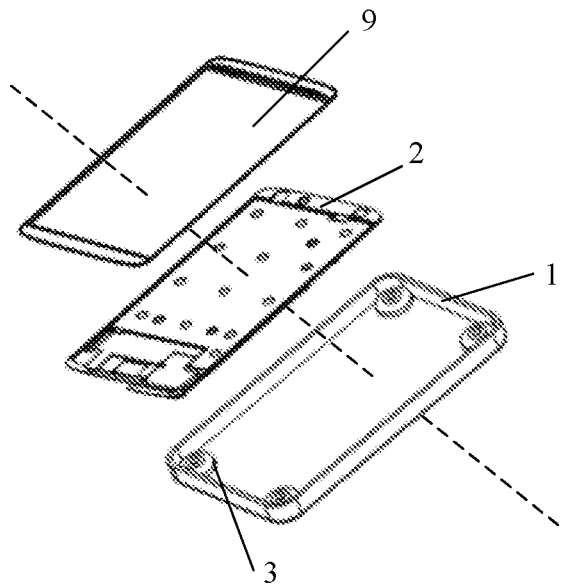
FIG. 1 is an exploded view of a terminal device provided by an embodiment of the present application.
Figure 2:
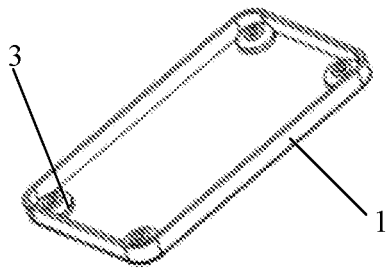
FIG. 2 is a structure diagram of a first shell provided by an embodiment of the present application.

As shown in FIG. 1 and FIG. 2, embodiments of the present application provide a shell structure which includes a first shell 1; herein, multiple lock catch structures 3 are installed on an inner surface of the first shell 1.

Alternatively, the shell structure further includes a second shell 2 which is arranged opposite to the first shell 1; herein, the lock catch structures 3 are arranged on the inner surface of the first shell 1 facing the second shell 2. Generally, the first shell 1 is taken as a rear shell of a terminal device, and the second shell 2 is taken as a front shell of the terminal device.

Alternatively, four lock catch structures 3 are arranged, and a deformation space allowing deformation of the lock catch structure 3 is formed between the lock catch structure 3 and a side wall of the first shell 1. When the lock catch structure 3 is extruded, a volume would be changed, and therefore the deformation space should be reserved.

Alternatively, the lock catch structure 3 is a columnar hollow structure and made of Thermoplastic Polyurethanes (TPU) having Shore hardness within a preset range. The TPU has outstanding integrated performances, such as high strength, high toughness, abrasion resistance and oil resistance and good processing performance. Alternatively, the lock catch structure 3 may be connected with the first shell 1 through blanching, nano-scale processing, double-shot molding and other processes.

Figure 3:
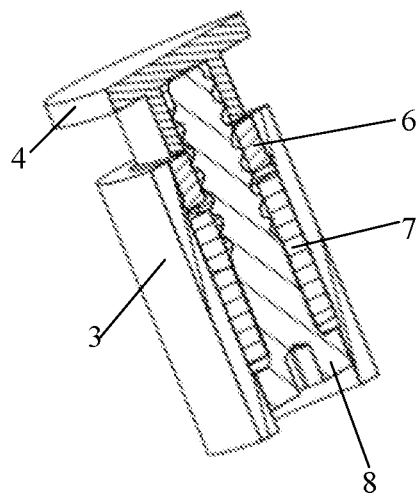
FIG. 3 is an axial section view when a lock catch structure and a self-tapping stud provided by an embodiment of the present application are in a matching state.
Figure 4:
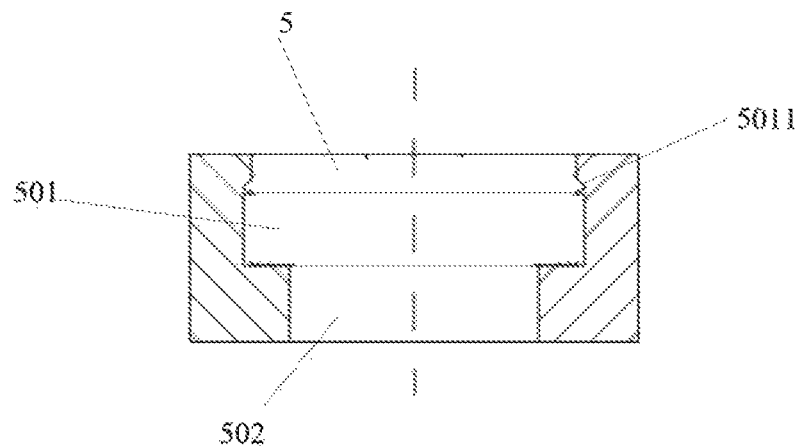
FIG. 4 is a structure diagram of a first through hole provided by an embodiment of the present application.

By referring to FIG. 1, FIG. 3 and FIG. 4, a first through hole 5 is formed by the lock catch structures 3 and includes a first round hole 501 with a first diameter and a second round hole 502 with a second diameter; herein, the first round hole 501 is coaxial and connected with the second round hole 502. A damping plate 6 and a compression part 7 are sequentially arranged in a direction facing the first shell 1 in the first through hole 5, and the first through hole 5 is connected with the damping plate 6 in a clamping way. The compression part 7 is located at one end of the first round hole 501 facing the first shell 1. The compression part 7 may be extruded when the damping plate 6 is subjected to an external force, thereby making the compression part 7 deformed.

Herein, the second diameter is less than the first diameter, so that the compression part 7 is stuck. The second round hole 502 is located at one end of the lock catch structure 3 facing the first shell 1.

Alternatively, the damping plate 6 is hard and made of polycarbonate or polyformaldehyde.

The compression part 7 is soft and made of silica gel.

Figure 5:
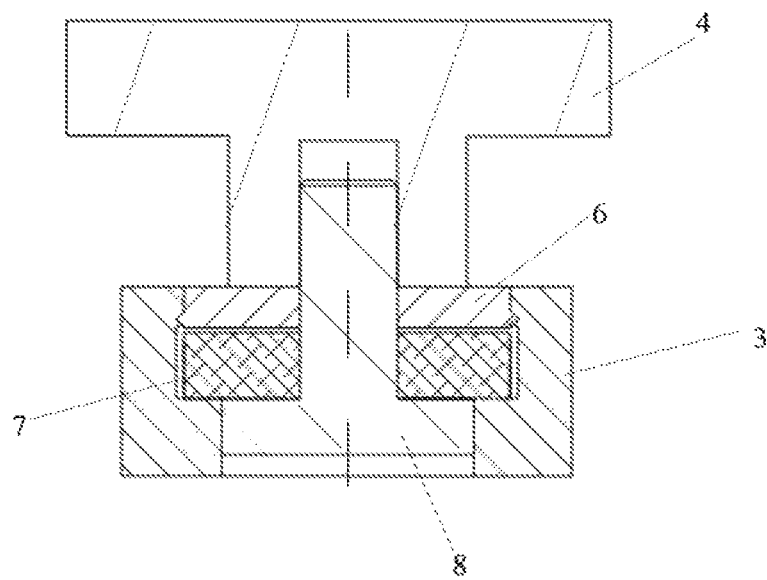
FIG. 5 is an axial section view when a lock catch structure and a self-tapping stud provided by an embodiment of the present application are in a static load state.
Figure 6:
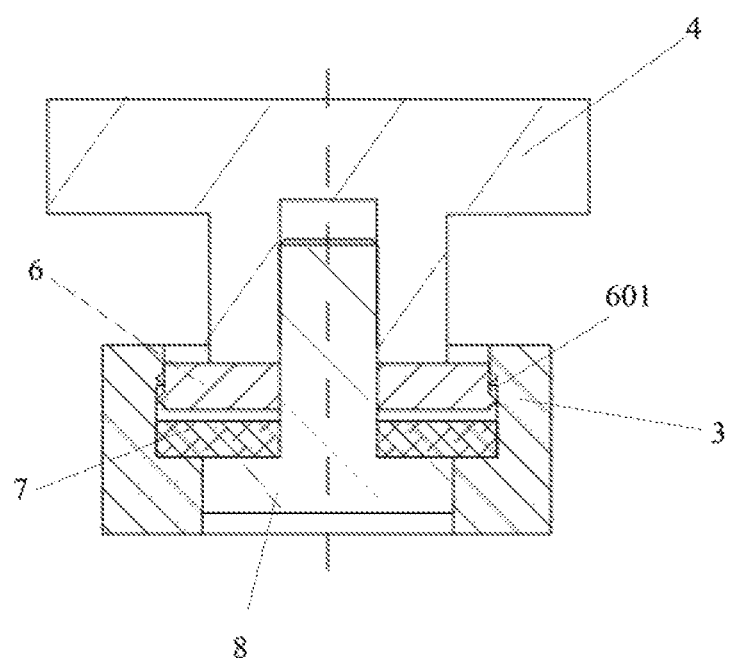
FIG. 6 is an axial section view when a lock catch structure and a self-tapping stud provided by an embodiment of the present application are in a damping state.

By referring to FIG. 4, FIG. 5 and FIG. 6, a first clamping part 5011 is formed on an inner wall of the first round hole 501, and the damping plate 6 has a second clamping part 601. The first clamping part 5011 and the second clamping part 601 are clamped with each other, thereby forming a clamping structure. The damping plate 6 is stuck in the first round hole 501. When installing the damping plate 6, it is only needed to compress the second clamping part 601 of the damping plate 6 into the first clamping part 5011 through the external force.

A second through hole matching with a self-tapping screw 8 is formed by the damping plate 6 and the compression part 7. The second shell 2 is provided with a self-tapping stud 4 matching with the self-tapping screw 8. A rigid connection of the self-tapping screw 8 with the self-tapping stud 4 is formed through the second through hole, in this way the first shell 1 is connected with the second shell 2. When installing the self-tapping screw 8, the self-tapping stud 4 is inserted into the second through hole first, and the self-tapping screw 8 is screwed into the self-tapping stud 4, thereby forming the rigid connection. The first shell 1 is connected with the second shell 2 by driving the first shell 1 via the lock catch structure 3 and driving the second shell 2 via the self-tapping stud 4.

By continuously referring to FIG. 6, the rigid connection transfers a pressure to the damping plate 6 when the first shell 1 or the second shell 2 is subjected to the pressure facing the inside of the shell structure, and the second clamping part 601 is departed from the first clamping part 5011 when the pressure reaches a preset threshold. The damping plate 6 compresses the compression part 7, thereby making the compression part 7 deformed, and accordingly damping the pressure which faces the inside of the shell structure on the first shell 1 or the second shell 2. In this way, the touch screen is prevented from damaging due to transfer of the pressure to the touch screen. The stability of the lock catch structure 3 is determined by the clamping structure formed by the first clamping part 5011 and the second clamping part 601. In case of drop impact, an instantaneous load of the clamping structure exceeds a preset threshold, and the second clamping part 601 is departed from the first clamping part 5011.

Alternatively, an avoiding space allowing deformation of the compression part 7 is formed between the first round hole 501 and the compression part 7, and a damping gap allowing deformation of the compression part 7 is formed between the damping plate 6 and the compression part 7. Through arranging the damping gap and the avoiding space, a damping effect of the compression part 7 may be improved effectively.

Alternatively, the first clamping part 5011 is a bulge structure which is located on a side surrounding part of the damping plate 6, and the second clamping part 601 is a groove structure matching with the first clamping part 5011. Specifically, a bearable static load between the first clamping part 5011 and the second clamping part 601 may be set as 150 Newtons (N), namely the lock catch structure 3 within 150N due to support by the clamping structure.

By continuously referring to FIG. 1, an embodiment of the present application further provides a terminal device which includes the above-mentioned shell structure; herein, the terminal device may be a smart phone or a tablet PC and so on.

Alternatively, the terminal device further includes a touch screen 9 which is fixedly connected with the second shell 2 of the shell structure.

Through providing the damping plate 6 and the compression part 7 which are departed from each other in the lock catch structure 3, the shell structure and the terminal device provided by the present application may effectively damp an external impact to which the shell structure is subjected, thereby avoiding losses due to breaking of the touch screen 9 when the touch screen 9 is subjected to the impact. The present application has simple fabricating process and low manufacturing cost, and may improve reliability and user experiences of the terminal device and generate a high economic value added.

The above are alternative implementation modes of the present application. It is to be noted that those of ordinary skill in the art may make various improvements and revisions without departing from the concept of the present application, and these improvements and revisions shall also fall within the protection scope of the present application.

INDUSTRIAL APPLICABILITY

The above-mentioned scheme has simple fabricating process and low manufacturing cost, and may improve reliability and user experiences of the terminal device and generate a high economic value added.

What is claimed is:

1. A shell structure, comprising a first shell (1); wherein a plurality of lock catch structures (3) are installed on an inner surface of the first shell (1) and a first through hole (5) is formed by the lock catch structure (3); a damping plate (6) and a compression part (7) are sequentially arranged in a direction facing the first shell (1) in the first through hole (5); and the first through hole (5) is connected with the damping plate (6) in a clamping way;

wherein the first through hole (5) comprises a first round hole (501) with a first diameter and a second round hole (502) with a second diameter; the first round hole (501) is coaxial and connected with the second round hole (502), and the second diameter is less than the first diameter; the second round hole (502) is located at one end of the lock catch structure (3) facing the first shell (1);

the compression part (7) is located at one end of the first round hole (501) facing the first shell (1); a first clamping part (5011) is formed on an inner wall of the first round hole (501), the damping plate (6) has a second clamping part (601); the first clamping part (5011) and the second clamping part (601) are clamped with each other to form a clamping structure; and the damping plate (6) is stuck in the first round hole (501);

wherein the shell structure further comprises a second shell (2) which is arranged opposite to the first shell (1); and the lock catch structure (3) is arranged on the inner surface of the first shell (1) facing the second shell (2).

2. The shell structure according to claim 1, wherein a second through hole matching with a self-tapping screw (8) is formed by the damping plate (6) and the compression part (7); the second shell (2) is provided with a self-tapping stud (4) matching with the self-tapping screw (8); a rigid connection of the self-tapping screw (8) with the self-tapping stud (4) is formed through the second through hole to connect the first shell (1) with the second shell (2).

3. The shell structure according to claim 2, wherein a pressure is transferred to the damping plate (6) by the rigid connection when the first shell (1) or the second shell (2) is subjected to the pressure facing an inside of the shell structure, and the second clamping part (601) is departed from the first clamping part (5011) when the pressure reaches a preset threshold; and the damping plate (6) compresses the compression part (7) to make the compression part (7) deformed.

4. A terminal device, comprising the shell structure according to claim 3.

5. A terminal device, comprising the shell structure according to claim 2.

6. The shell structure according to claim 1, wherein an avoiding space allowing deformation of the compression part is formed between the first round hole (501) and the compression part (7);

a damping gap allowing deformation of the compression part (7) is formed between the damping plate (6) and the compression part (7); and a deformation space allowing deformation of the lock catch structure (3) is formed between the lock catch structure (3) and a side wall of the first shell (1).

7. A terminal device, comprising the shell structure according to claim 6.

8. The shell structure according to claim 1, wherein the first clamping part (5011) is a bulge structure located on a side surrounding part of the damping plate (6), and the second clamping part (601) is a groove structure matching with the first clamping part (5011).

9. A terminal device, comprising the shell structure according to claim 8.

10. The shell structure according to claim 1, wherein the damping plate (6) is made of polycarbonate or polyformaldehyde;

the compression part (7) is made of silica gel; and the lock catch structure (3) is a columnar hollow structure and made of Thermoplastic Polyurethanes (TPU) having Shore hardness within a preset range.

11. A terminal device, comprising the shell structure according to claim 10.

12. A terminal device, comprising the shell structure according to any one of claims 1.

13. The terminal device according to claim 12, wherein the terminal further comprises a touch screen (9) which is fixedly connected with a second shell (2) of the shell structure.

* * * * *